(12) United States Patent
Ler et al.

(10) Patent No.: US 9,166,052 B1
(45) Date of Patent: *Oct. 20, 2015

(54) MULTIPLE GATE SEMICONDUCTOR DEVICES AND THEIR APPLICATIONS

(71) Applicant: Altera Corporation, San Jose, CA (US)

(72) Inventors: Chun Lee Ler, Tangkak (MY); Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/576,610

(22) Filed: Dec. 19, 2014

Related U.S. Application Data

(63) Continuation of application No. 13/832,619, filed on Mar. 15, 2013, now Pat. No. 8,928,382.

(51) Int. Cl.
*H03H 11/16* (2006.01)
*H01L 29/78* (2006.01)
*H01L 27/06* (2006.01)
*H01L 29/93* (2006.01)

(52) U.S. Cl.
CPC ........ *H01L 29/7855* (2013.01); *H01L 27/0629* (2013.01); *H01L 29/93* (2013.01)

(58) Field of Classification Search
None
See application file for complete search history.

(56) References Cited

U.S. PATENT DOCUMENTS

| | | | | |
|---|---|---|---|---|
| 7,005,936 | B2 * | 2/2006 | Tanzawa | 331/176 |
| 7,579,897 | B2 * | 8/2009 | Goodnow et al. | 327/429 |
| 7,956,669 | B2 * | 6/2011 | Chuang et al. | 327/427 |
| 2008/0143434 | A1 * | 6/2008 | Ito et al. | 327/563 |
| 2008/0144252 | A1 * | 6/2008 | Abadeer et al. | 361/277 |
| 2008/0315246 | A1 * | 12/2008 | Ueno et al. | 257/133 |
| 2009/0309162 | A1 * | 12/2009 | Baumgartner et al. | 257/368 |
| 2011/0089991 | A1 * | 4/2011 | Rangarajan et al. | 327/427 |
| 2011/0156829 | A1 * | 6/2011 | Wang | 331/117 FE |

* cited by examiner

*Primary Examiner* — Cassandra Cox
(74) *Attorney, Agent, or Firm* — Ward & Zinna, LLC

(57) ABSTRACT

A multiple gate semiconductor structure is disclosed having a thin segment of semiconductor with first and second major surfaces that are opposite one another, a first gate on the first major surface of the segment, a second gate on the second major surface of the segment opposite the first gate, a first differential input coupled to the first gate, and a second differential input coupled to the second gate. Preferably the semiconductor structure is symmetrical about a plane that extends through the thin segment between the first and second major surfaces. When a first voltage of a first polarity is applied to the first input and a second voltage of the same magnitude as that of the first voltage but of opposite polarity is applied to the second input, a virtual ground is established in the structure near its center of the segment.

20 Claims, 6 Drawing Sheets

800

MULTIPLE GATE SEMICONDUCTOR DEVICES AND THEIR APPLICATIONS

CROSS-REFERENCE TO RELATED APPLICATION

This application is a continuation of application Ser. No. 13/832,619, filed Mar. 15, 2013, which application is incorporated by reference herein in its entirety.

BACKGROUND

This relates to multiple gate semiconductor devices such as FinFETs (Fin Field Effect Transistors) and circuit applications of such devices as in a varactor.

A conventional field effect transistor (FET) is an essentially planar device having a gate structure that extends across the surface of a semiconductor such as monocrystalline silicon and doped source and drain regions in the semiconductor on either side of the gate. The gate is insulated from the semiconductor by a thin layer of an insulator such as silicon oxide. A voltage applied to the gate controls current flow in an un-doped channel that extends between the doped source and drain regions in the semiconductor beneath the gate.

The switching speed of the FET depends on the amount of current flow between the source and drain regions. Current flow depends on the width of the gate where width is the direction in the channel that is perpendicular to the direction of current flow. With the continuing demand for higher speed transistors for use in communication and computer equipment, there is a continuing interest in making transistor devices with wider gates.

FinFETs have been developed to obtain larger gate widths A fin is a thin segment of semiconductor material standing on edge, thereby making available multiple surfaces for the formation of gate structures. FIG. 1 depicts an illustrative Fin-FET 100 comprising four fins 110, 120, 130, 140. The fins have first and second major surfaces, such as surfaces 112, 114, that are opposite one another and usually are symmetric about a center plane that bisects the fin lengthwise. Major surfaces 112, 144 are often illustrated as being parallel as in U.S. Pat. No. 7,612,405 B2 or Pub. No. US2008/0128797 A1; but process limitations usually result in surfaces that slope outwardly from top to bottom of the fin with the result that the cross-section of the fin is trapezoidal in shape. FinFET 100 has a common gate structure 150. In other embodiments, a separate gate structure may be located on each surface of each fin. The width of the gate structures on each fin can be as much as T+2H where T is the distance between the first and second major surfaces of the fin and H is the height of the fin.

Doped source and drain regions are formed on opposite sides of the gates. As in a planar FET, a voltage applied to the gate controls current flow in a channel that extends between the doped source and drain regions in the semiconductor beneath the gate.

A common application of a planar FET is to provide capacitance in a varactor. In such an application, the source and drain of the FET are coupled together; and the source and drain serve as one plate of the capacitor and the gate serves as the other plate with the two plates being separated by the gate insulator.

FinFETs have the advantage that they permit device scaling to technology nodes such as 20 nanometers (nm) and smaller. Thus, it is desirable to be able to incorporate FinFETs in numerous circuit applications such as those that provide capacitance in varactors and other circuits. However, the narrow fin structure of the FinFET produces a higher parasitic resistance due to both the higher channel resistance $R_{ch}$ in the un-doped ultra-thin channel and the much higher (20×) source drain resistance compared to the source-drain resistance in a planar FET. See, V. Subramanian et al., "Planar Bulk MOSFETs Versus FinFETs: An Analog/RF Perspective," *IEEE Trans. Electron.* Devices (December 2006); T. Cakici et al., "High Q and High Tuning Range FinFET Based Varactors for Low Cost SoC Integration," 2006 *IEEE Int. SOI Conf. Proceedings*, p. 67, which are incorporated herein by reference in their entirety. The higher parasitic resistance reduces the quality factor, Q, of varactors formed from conventional FinFETs.

FinFETs can be connected as capacitors in multiple ways as described in the above-referenced paper of Cakici et al. In one embodiment, the gates of one fin are connected together to serve as a first plate of the capacitor and the source and drain of the fin are connected together to serve as a second plate. In a second embodiment that can be implemented with a FinFET with two independent gates, one gate is used as the first plate and the second gate as the second plate. The second embodiment provides a structure with a higher quality factor since it eliminates the parasitic source drain resistance losses. However, the second embodiment is not area efficient compared to the first because it requires four times as many fins as the first to provide the same capacitance. In addition, in the second embodiment, it is desirable to connect a tuning voltage to the fin; but such connection must be made through a large series resistance that is used to block transmission of AC signals through the tuning voltage connection. Such a resistance also consumes valuable device area.

SUMMARY

The present invention is an improved multiple gate semiconductor device and circuit applications thereof.

In a preferred embodiment of the invention, the device comprises a multiple gate semiconductor structure having a fin with first and second major surfaces that are opposite one another, a first gate on the first major surface of the fin, a second gate on the second major surface of the fin opposite the first gate, a first differential input coupled to the first gate, and a second differential input coupled to the second gate. Preferably the semiconductor structure is symmetrical about a plane that bisects the fin between the first and second major surfaces.

When a first voltage of a first polarity is applied to the first input and a second voltage of the same magnitude as that of the first voltage but of opposite polarity is applied to the second input, a virtual ground is established in the semiconductor structure near its center. Advantageously, a tuning voltage, Vtune, may be coupled to the semiconductor structure at virtual ground.

The multiple gate semiconductor structure of the present invention can be used in numerous applications. For example, the semiconductor structure may be used as a varactor in the various circuit applications in which a varactor is used. It may be used in an LC tank circuit, in an oscillator, in a frequency divider, and in a phase shifter. Illustrative examples of such applications are set forth below.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
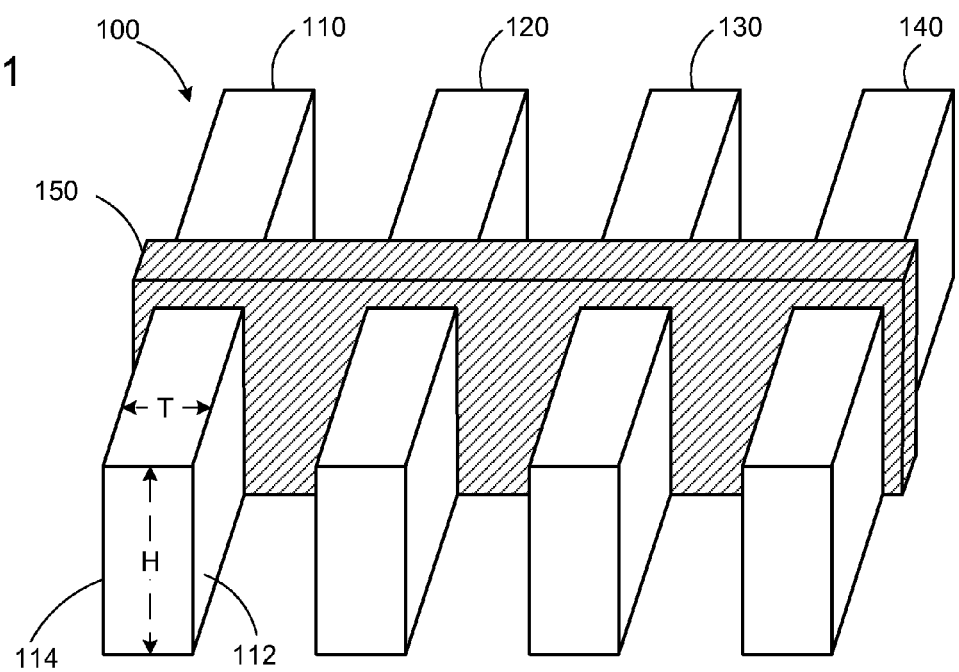
FIG. 1 is a perspective view of a prior art FinFET.
Figure 2:
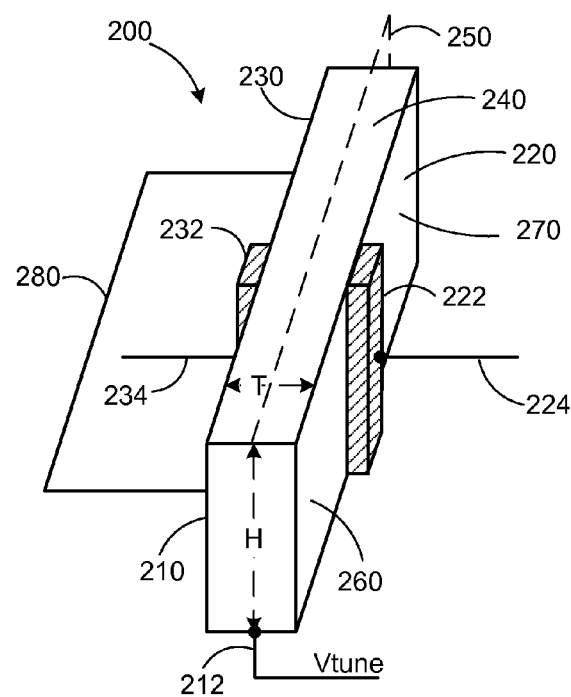
FIG. 2 is a perspective view of an illustrative embodiment of the invention.

FIG. 2 is a perspective view of an illustrative embodiment of a multiple gate FinFET structure 200 of the invention, Multiple gate structure 200 comprises a fin 210 having first and second major surfaces 220, 230 and an upper surface 240 that extends between the upper edges of the first and second major surfaces 220, 230, a first gate 222 on first major surface 220 of the fin, a second gate 232 on second major surface 230 of the fin opposite first gate 222, a first differential input 224 coupled to first gate 222, and a second differential input 234 coupled to second gate 232. Gates 222, 232 are separated from fin 210 by an insulating layer (not shown). Fin 210 is a thin segment of a semiconductor material such as monocrystalline silicon. First and second major surfaces 220, 230 are opposite one another and preferably are symmetrical about a plane 250 extending through the center of fin 210 between first and second major surfaces 220, 230. Source and drain regions 260, 270 are located on opposite sides of gates 222, 232 and are coupled together electrically to form a varactor. This coupling is represented in FIG. 2 by lead 280. While the coupling may be made external to fin 210, the coupling is preferably made by forming highly doped source and drain regions in a well of the same polarity (e.g., N+ source and drain regions in an Nwell).

When a first voltage of a first polarity is applied to first differential input 224 and a second voltage of the same magnitude as that of the first voltage but of opposite polarity is applied to second differential input 234, a virtual ground is established in structure 200 near the center of fin 210. A circuit connection 212 to fin 210 permits a tuning voltage, $V_{tune}$, to be applied to fin 210 at virtual ground. Since the connection is at virtual ground, an external resistance is not needed to block transmission of AC signals; but a small resistance may be used as a precaution in the event structure 200 is not perfectly symmetrical.

Figure 3:
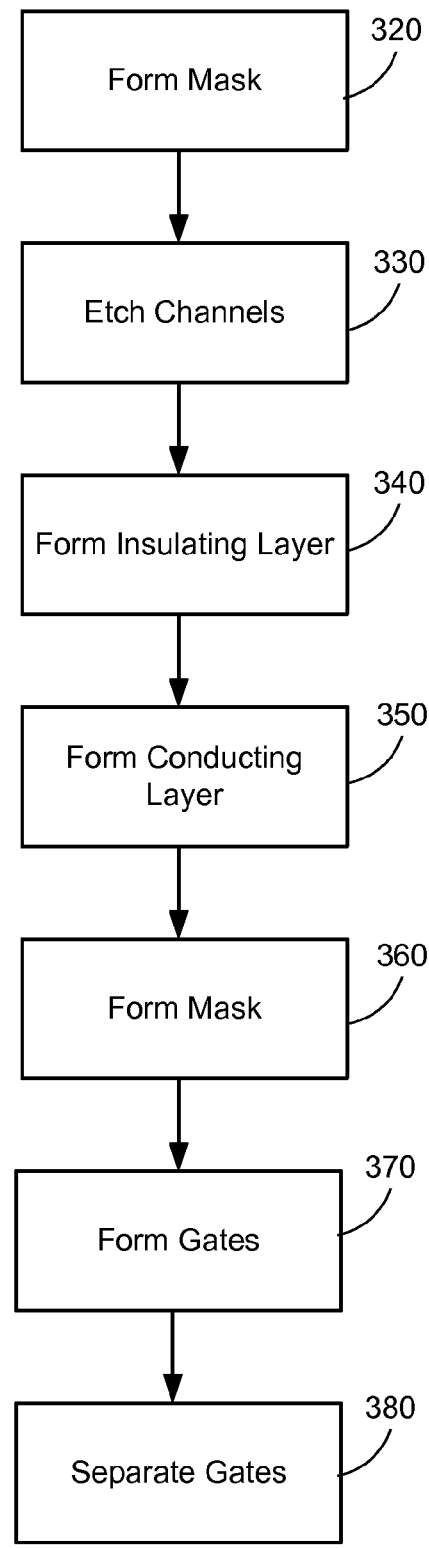
FIG. 3 is a flow chart depicting steps used in making the embodiment of FIG. 2.

FIG. 3 is a flow chart depicting the process for forming structure 200 of FIG. 2. The process is performed on a wafer of semiconductor material such as monocrystalline silicon. At step 320, a mask pattern is formed on a surface of the silicon using well-known photolithographic techniques. The mask pattern defines at least two parallel channels to be formed in the silicon. At step 330, the mask pattern is used to control the etching of parallel channels in the silicon using known etching technology. As a result of step 330, at least one fin is formed in the silicon, the fin having first and second major surfaces 220, 230 and upper surface 240 that extends between the upper edges of the first and second major surfaces.

At step 340 an insulating layer is formed on first and second major surfaces 220, 230 and upper surface 240. Illustratively, the insulating layer may be silicon oxide. At step 350, a conducting layer is formed on the insulating layer. Illustratively, this layer may be aluminum or poly silicon. At step 360, a mask pattern is formed on the conducting layer to define the shape of the gates. At step 370, the mask pattern is used to form the gates in the desired shape. Where multiple gates are to be formed, the gates are separated at step 380 using one of a variety of known techniques. For example, the conducting layer can be planarized down to upper surface 240 of the fin, thereby separating the gate structure to form first gate 222 on first major surface 220 and second gate 232 on second major surface 230.

Figure 4:
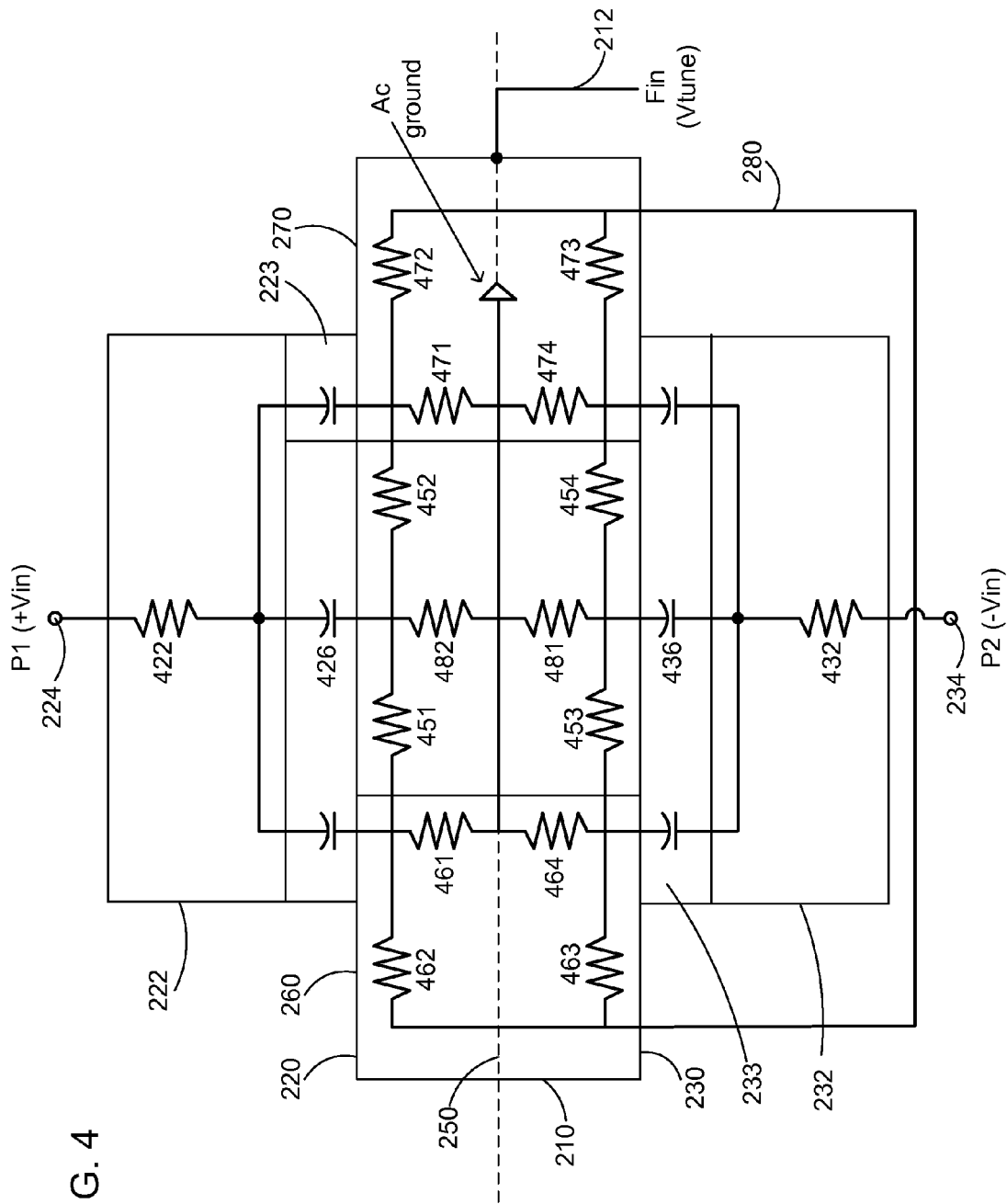
FIG. 4 is an equivalent circuit model depicting various circuit elements of the embodiment of FIG. 2.

FIG. 4 is an equivalent circuit model of semiconductor structure 200 of FIG. 2. The diagram depicts fin 210, first and second major surfaces 220, 230, first and second gates 222, 232, first and second differential inputs 224, 234, symmetry plane 250, and source and drain regions 260, 270 of FIG. 2. Gates 222, 232 are separated from fin 210 by insulating layers 223, 233. FIG. 4 also models the various resistances and capacitances of the device of FIG. 2. In particular, the resistances of gates 222, 232 are modeled by resistors 422, 432, respectively; and the capacitances between gates 222, 232 and fin 210 are modeled by capacitors 426, 436, respectively. The resistances in the channel under the first major surface 220 are modeled by resistors 451, 452; and the resistances in the channel under the second major surface are modeled by resistors 453, 454. Resistances in the source region are modeled by resistors 461-464; and resistances in the drain region are modeled by resistors 471-474. The resistance in the region under the gates in the direction that extends through the fin between the first and second major surfaces 220, 230 is modeled by resistances 481, 482. The coupling between source and drain regions 260, 270 is represented by lead 280 although this coupling may be effected within fin 210.

For the case where structure 200 is symmetrical about plane 250, there is a virtual ground at plane 250. As noted above, a connection 212 permits tuning voltage, Vtune, to be coupled to structure 200 at this point. If desired, this coupling may be made through a small series resistance (not shown).

The capacitance of structure 200 can be shown to be approximately twice the capacitance C between one of gates 222, 232 and fin 210. The quality factor, Q, can be shown to be approximately $1/\omega CR$ where C is the capacitance between one of gates 222, 232 and fin 210 and R is the resistance of the fin between first and second major surfaces 220, 230.

Figure 5:
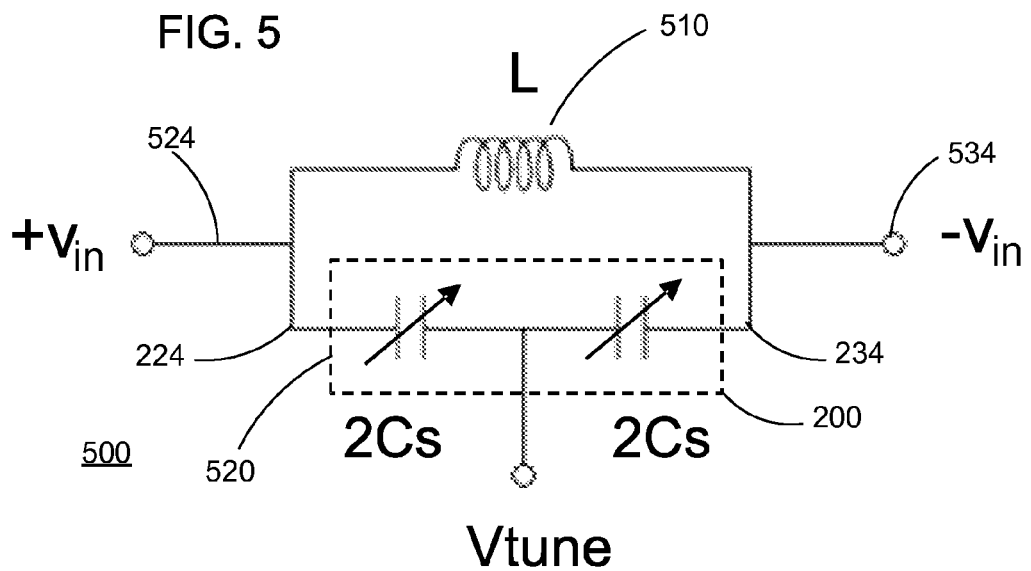
FIG. 5 is a schematic diagram depicting a first circuit application of the embodiment of FIG. 2.

Structure 200 can be connected in parallel with an inductor to form an LC tank circuit 500 as shown in FIG. 5. Circuit 500 comprises an inductor 510 and a capacitor 520 connected in parallel between first and second differential inputs 524, 534. Circuit 500 will resonate at a frequency determined by the inductance of inductor 510 and the capacitance of capacitor 520. Advantageously capacitor 520 is implemented using a FinFET structure such as that of FIG. 2 where the first and second differential inputs 224, 234 of structure 200 are coupled to first and second differential inputs 524, 534 and the capacitance of capacitor 520 may be varied by Vtune.

Figure 6:
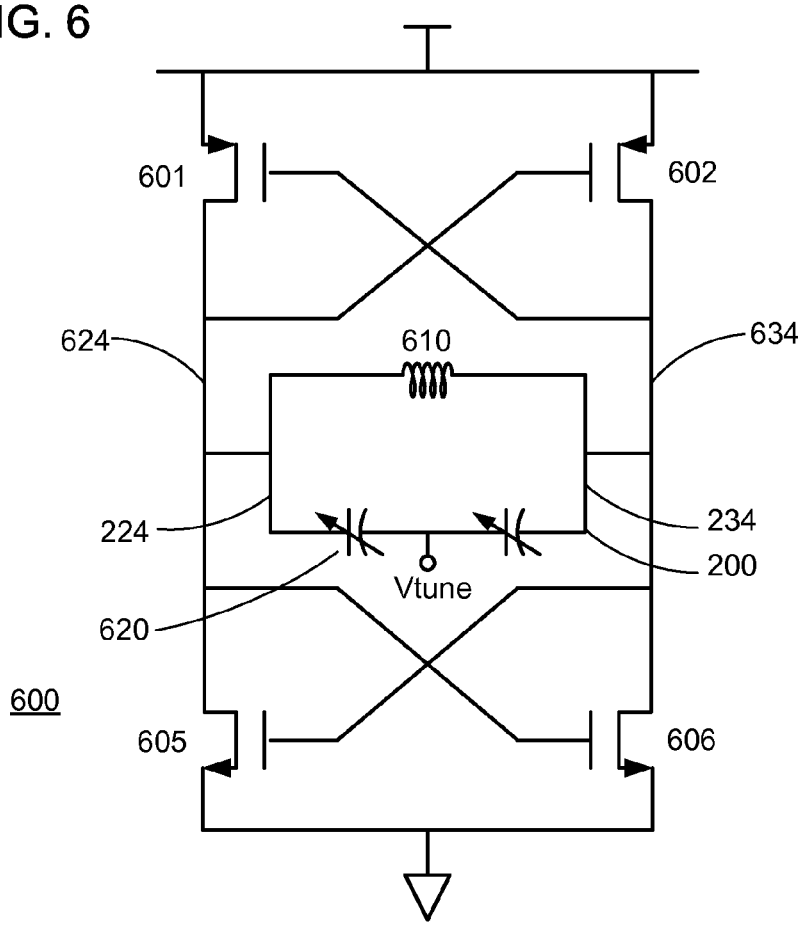
FIG. 6 is a schematic diagram depicting a second circuit application of the embodiment of FIG. 2.

LC tank circuit 500 can be used to form a voltage controlled oscillator (VCO) 600 as shown in FIG. 6. Oscillator 600 comprises first and second cross-coupled PMOS transistors 601, 602, first and second cross-coupled NMOS transistors 605, 606, an inductor 610 and a capacitor 620 connected between first and second nodes 624, 634. The sources of the PMOS transistors are coupled to a power supply and the sources of the NMOS transistors are coupled to ground. The drains of PMOS transistor 601 and NMOS transistor 605 are coupled to node 624; and the drains of PMOS transistor 602 and NMOS transistor 606 are coupled to node 634. The voltages at nodes 624, 634 will be recognized by those skilled in the art as having equal magnitude but opposite polarity during operation of the oscillator. Further details concerning the operation of oscillator 600 may be found in A. Hajimiri and T. Lee, "Design Issues in CMOS Differential LC Oscillators," *IEEE J. of Solid-State* Circuits, Vol. 34, No. 5, pp. 717-724 (May 1999) and D. Ham and A. Hajimiri, "Concepts and Methods in optimization of Integrated LC VCOs," *IEEE J. of Solid-State* Circuits, Vol. 36, No. 6, pp. 896-909 (June 2001), which are incorporated herein by reference. Advantageously, capacitor 620 is implemented using a FinFET structure such as that of FIG. 2 where the first and second differential inputs 224, 234 of structure 200 are coupled to first and second nodes 624, 634 and the capacitance of capacitor 620 may be varied by Vtune.

Figure 7:
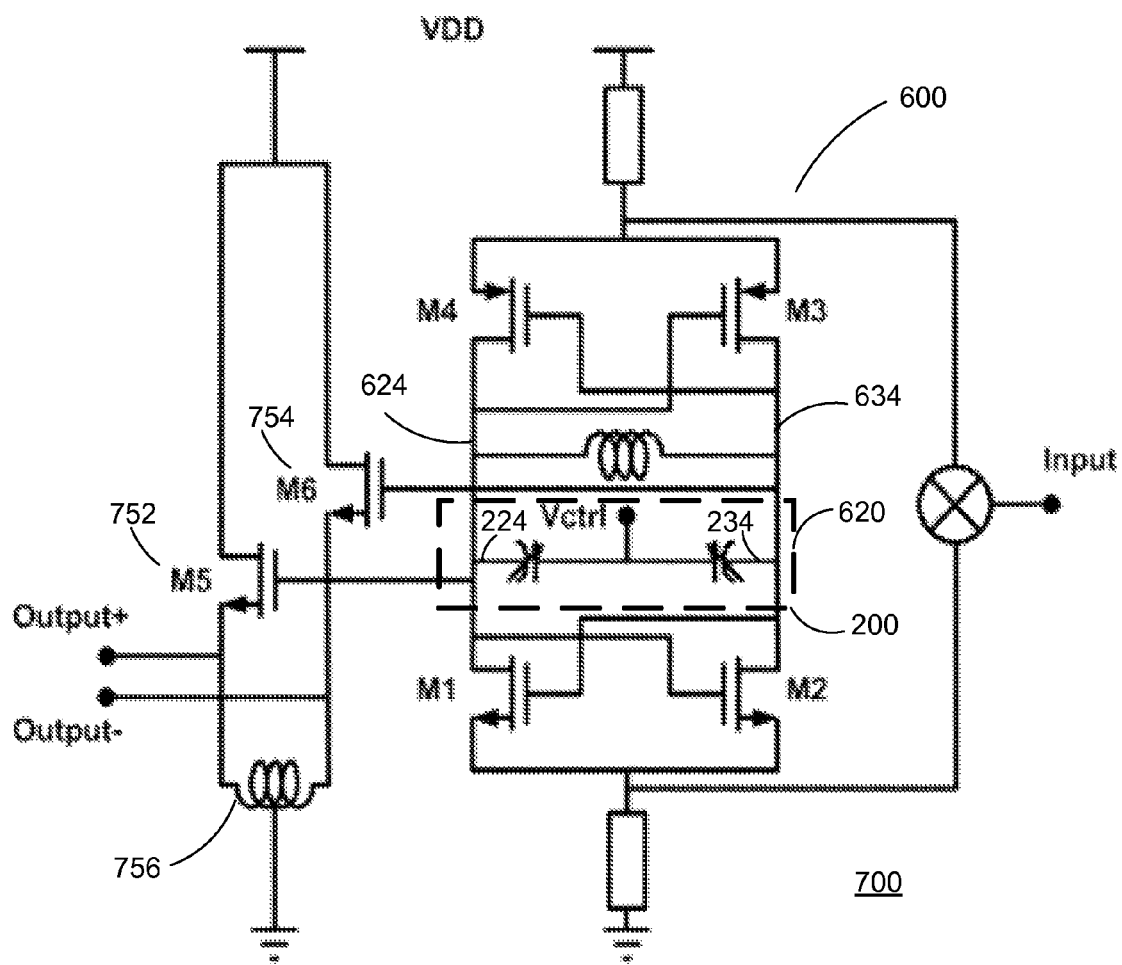
FIG. 7 is a schematic diagram depicting a third circuit application of the embodiment of FIG. 2.
Figure 8:
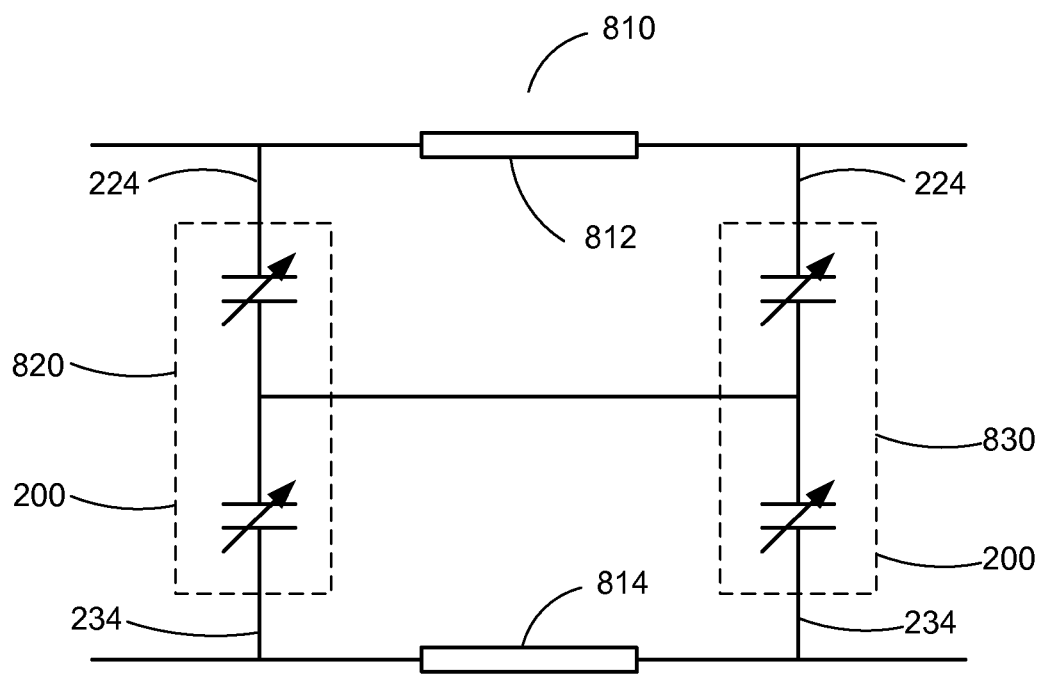
FIG. 8 is a schematic diagram depicting a fourth circuit application of the embodiment of FIG. 2.

Voltage controlled oscillator (VCO) 600 can be used as a frequency divider 700 as shown in FIG. 7. Frequency divider 700 comprises VCO 600 and an output network 750 comprising third and fourth NMOS transistors 752, 754 and center tapped inductor 756 that is grounded at its center tap. VCO 600 of FIG. 7 is the same as VCO 600 of FIG. 6 and bears the same element numbers. NMOS transistors 752, 754 are connected between a power supply and opposites ends of inductor 756. The gate of NMOS transistor 752 is coupled to node 624; and the gate of NMOS transistor 754 is coupled to node 634. Further details concerning the operation of divider 700 are set forth in Tang-Nian Luo and J.-Y. E. Chen, "A 44 GHz 0.18 um CMOS Superharmonic Frequency Divider," *Microwave Symposium*, pp. 1409-1412 (June 2007) which is incorporated herein by reference. Advantageously, capacitor 620 is implemented using a FinFET structure such as that of FIG. 2 where the first and second differential inputs 224, 234 of structure 200 are coupled to first and second nodes 624, 634 and the capacitance of capacitor 620 may be varied by Vtune.

Structure 200 can also be used in a differential phase shifter 800 as shown in FIG. 800. Phase shifter 800 comprises a differential transmission line 810 comprising first and second transmission lines 812, 814 and first and second differential varactors 820, 830 connected at each end of the transmission lines 812, 814 Further details concerning the operation of phase shifter 800 are set forth in Y. Yu et al. "A 60 GHz Digitally Controlled Phase Shifter in CMOS," *ESSCIRC* 2008, pp. 250-253 (September 2008) which is incorporated herein by reference. Advantageously, varactors 820, 830 are implemented using FinFET structures such as those of FIG. 2 where the first and second differential inputs 224, 234 of one structure 200 are coupled between first ends of transmission lines 812, 814, first and second differential inputs 224, 234 of a second structure 200 are coupled between second ends of transmission lines 814, and the capacitance of varactors 820, 830 may be varied by Vtune.

As will be apparent to those skilled in the art, numerous variations may be practiced within the spirit and scope of the present invention. For example, while the invention has been described for a FinFET made of silicon, numerous other semiconductor materials may also be used in the practice of the invention such as germanium, gallium arsenide and other III-V compounds. While one process has been described for the formation of structure 200, other processes may also be used; and numerous variations in these processes may also be practiced. And while several circuit applications have been described in which structure 200 may be used, other applications will be apparent to those skilled in the art from the descriptions given above. Moreover, while the invention has been described in the context of a multiple gate FinFET, the invention may also be practiced with other multiple gate devices.

What is claimed is:

1. A semiconductor structure comprising:
   a thin segment of a semiconductor having first and second major surfaces,
   a first gate on the first major surface of the segment,
   a second gate on the second major surface of the segment opposite the first gate, and
   first and second differential inputs coupled, respectively, to the first and second gates for applying to the gates signals of opposite polarity.

2. The semiconductor structure of claim 1 wherein the thin segment of semiconductor and the first and second gates comprise a FinFET (Fin field effect transistor).

3. The semiconductor structure of claim 2 wherein source and drain regions are located in the segment on opposite side of the gates.

4. The semiconductor structure of claim 1 wherein the semiconductor is monocrystalline silicon.

5. The semiconductor structure of claim 1 wherein the first and second gates and the thin segment of semiconductor are symmetrical about a plane through the center of the thin segment and a virtual ground is established in the thin segment substantially midway between the first and second major surfaces.

6. The semiconductor structure of claim 5 further comprising a circuit connection to the thin segment of semiconductor for applying a tuning voltage.

7. The semiconductor structure of claim 1 wherein the effective capacitance between the first and second differential inputs is approximately twice the capacitance between a gate and the thin segment of semiconductor.

8. The semiconductor structure of claim 1 wherein the quality factor of the structure is approximately $1/\omega CR$, where C is the capacitance between a gate and the thin segment of semiconductor and R is the resistance of the thin segment of semiconductor between the first and second major surfaces.

9. The semiconductor structure of claim 1 further comprising an inductor coupled between the first and second differential inputs to form an LC tank circuit.

10. The semiconductor structure of claim 9 wherein the LC tank circuit is coupled to a power supply and ground to form an oscillator.

11. The semiconductor device of claim 10 wherein the first and second differential inputs are coupled to a pair of cross-coupled PMOS transistors that are coupled to a power supply and to a pair of cross-coupled NMOS transistors that are coupled to ground.

12. An LC-tank circuit comprising:
   an inductor and a varactor connected in parallel between a first differential input and a second differential input, the varactor comprising:
   a thin segment of semiconductor material having first and second major surfaces,
   a first gate on the first major surface of the thin segment,
   a second gate on the second major surface of the thin segment opposite the first gate,
   the first differential input being coupled to the first gate for applying a voltage of a first polarity, and
   the second differential input being coupled to the second gate for applying a voltage of a second polarity opposite the first polarity.

13. The circuit of claim 12 wherein a virtual ground is established in the thin segment of semiconductor material further comprising a circuit connection to the thin segment of semiconductor material for applying a tuning voltage.

14. The circuit of claim 12 wherein the effective capacitance between the first and second differential inputs is approximately twice the capacitance between a gate and the thin segment of semiconductor.

15. The circuit of claim 12 wherein the LC tank circuit is coupled to a power supply and ground to form an oscillator.

16. The circuit of claim 12 wherein the first and second differential inputs are coupled to a pair of cross-coupled PMOS transistors that are coupled to a power supply and to a pair of cross-coupled NMOS transistors that are coupled to ground.

17. The circuit of claim 12 wherein the first and second gates and the thin segment of semiconductor material are symmetrical about a plane through the center of the thin segment.

18. A differential phase shifter comprising:
- a first transmission line having first and second ends;
- a second transmission line having first and second ends;
- a first varactor coupled between the first ends of the first and second transmission lines; and
- a second varactor coupled between the second ends of the first and second transmission lines wherein each of the first and second varactors comprises:
- a thin segment of a semiconductor having first and second major surfaces,
- a first gate on the first major surface of the segment,
- a second gate on the second major surface of the segment opposite the first gate, and
- first and second differential inputs coupled, respectively, to the first and second gates for applying to the gates signals of opposite polarity,
- the first and second differential inputs of the first varactor being coupled between the first ends of the first and second transmission lines and the first and second differential inputs of the second varactor being coupled between the second ends of the first and second transmission lines.

19. The differential phase shifter of claim 18 wherein the first and second gates and the thin segment of semiconductor of each of the first and second varactors are symmetrical about a plane through the center of the thin segment.

20. The differential phase shifter of claim 18 further comprising a circuit connection to the thin segment of semiconductor for applying a tuning voltage.

* * * * *